(12) United States Patent
Nojima et al.

(10) Patent No.: US 6,333,203 B1
(45) Date of Patent: Dec. 25, 2001

(54) METHOD OF FORMING A RESIST PATTERN

(75) Inventors: Shigeki Nojima; Koji Hashimoto, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/383,960

(22) Filed: Aug. 27, 1999

(30) Foreign Application Priority Data

Aug. 27, 1998 (JP) .......................................... 10-241529

(51) Int. Cl.⁷ .............................................. H01L 21/66
(52) U.S. Cl. ................. 438/14; 438/7; 430/30
(58) Field of Search ............... 438/14, 7, 16, 438/65, 31, 32; 250/208.1

(56) References Cited

U.S. PATENT DOCUMENTS 5,472,829 * 12/1995 Ogawa ............................... 430/325
5,763,124 * 6/1998 Koizumi et al. ..................... 430/30

* cited by examiner

Primary Examiner—David Nelms
Assistant Examiner—Dung A Le
(74) Attorney, Agent, or Firm—Finnegan, Henderson, Farabow, Garrett & Dunner, L.L.P.

(57) ABSTRACT

In a method of forming a resist pattern, a simulation is in advance carried out to select a thickness of the resist film and a thickness of the underlying film to have certain values so that the contrast of the latent image becomes a threshold value or less. The simulation includes the steps of calculating a light intensity profile of a latent image formed in a resist film in a depth direction thereof by an exposure, slicing the light intensity profile of the latent image in the depth direction of the resist film, at a desired position, obtaining a maximum value and a minimum value of light intensity of a latent image at the position where the latent image profile is sliced, calculating a contrast of the latent image on the basis of the maximum and minimum values of the light intensity of the latent image, and determining a thickness of the resist film and a thickness of an underlying film of the resist film to have values so that the contrast becomes a threshold value or less. A resist pattern is then formed on a semiconductor substrate on the basis of the values of the thicknesses determined in the determining step.

19 Claims, 4 Drawing Sheets

METHOD OF FORMING A RESIST PATTERN

BACKGROUND OF THE INVENTION

The present invention relates to a method of forming a resist pattern in a step of a process of manufacturing a semiconductor device, and more specifically to a method of determining the thickness of a resist film and the structure and thickness of a film underlying the resist film, which can be applied to, for example, a photolithographic step.

Conventionally, in a step during the manufacture of a semiconductor device, a photoresist film formed on a semiconductor substrate is exposed to light, in order to form a pattern of the photoresist on the semi-conductor substrate (that is, a semiconductor wafer). At the time of the exposure, the light energy is absorbed into the photoresist film in a certain distribution in the depth direction of the photoresist film. In this manner, a standing wave which corresponds to the wavelength of the light during the exposure is created in the resist film.

Due to the occurrence of the standing wave during the exposure, an irregularity (of recesses and projections) that resembles the shape of the standing wave is created on the side wall of the resist pattern obtained developing the exposed resist.

When the shape of a standing wave is created on the side wall of a resist pattern as described above, some problems may occur. For example, measurements of the pattern of the underlying layer that is etched using a resist pattern as a mask may vary from one another. In order to avoid such problems, the side wall of the resist pattern should be made as smooth as possible. Accordingly, the occurrence of a standing wave within a resist film, as described above, should be inhibited or at least suppressed. This can be achieved by optimizing the thickness of the resist film and the structure and thickness of the film underlying the resist in advance by simulation.

In the meantime, in order to accurately observe the state of occurrence of a standing wave within a resist film by simulation, it is necessary to obtain a number of resist parameters with high accuracy, such as the type of the resist, the dissolving speed of the resist, the diffusion length of the acid depending upon the temperature of the post exposure bake (PEB), etc.

However, it is very difficult to obtain all these parameters accurately, and further, with the conventional simulation technique, there has been no methods of quantitatively determining the shape of a resist after calculating the resist shape. Therefore it has not been possible to optimize the parameters such as the thickness of the resist film and the structure and thickness of the film underlying the resist.

As described above, the conventional method of forming a resist pattern entails such a problem that the occurrence of a standing wave within a resist film cannot be avoided, i.e., the conditions such as the thickness of the resist film and the structure and thickness of the film underlying the resist film cannot be optimized in advance by simulation.

BRIEF SUMMARY OF THE INVENTION

The present invention has been proposed as a solution to the above-described problems of the conventional technique, and the object is to provide a method of forming a resist pattern that is capable of optimizing the thickness of the resist film, the thickness of the film underlying the resist film, and the structure of the underlying resist film under a condition where the type of the resist has been determined, in order to minimize the occurrence of a standing wave within the resist film.

According to the present invention, there is provided a method of forming a resist pattern, comprising the steps of calculating a light intensity profile of a latent image formed in a resist film in a depth direction by an exposure; slicing the light intensity profile of the latent image in the depth direction of the resist film at a desired position; obtaining a maximum value and a minimum value of light intensity of a latent image at the position where the latent image profile is sliced; calculating the contrast of the latent image on the basis of the maximum and minimum values of the light intensity of the latent image; and determining a thickness of the resist film and a thickness of an underlying film under the resist film to have values such that the contrast becomes a predetermined value or less; and forming a resist pattern on the semiconductor substrate on the basis of the values of the determined thickness.

In the method of forming a resist pattern, according to the present invention, the position where the latent image profile is sliced may be the position of an edge defining a resist pattern size.

In the method of forming a resist pattern, according to the present invention, the predetermined value of the contrast may be determined with correlation to an experimental value.

In the method of forming a resist pattern, according to the present invention, the predetermined value of the contrast may be 0.3 or less.

In the method of forming a resist pattern, according to the present invention, the predetermined value of the contrast of the latent image may be a threshold contrast value.

In the method of forming a resist pattern, according to the present invention, the thickness of the film underlying the resist film may include the thickness of an anti-reflection film formed on and under the resist film.

In the method of forming a resist pattern, according to the present invention, the determining step further may include determination of the structure of the film underlying the resist film. The position where the latent image profile is sliced may be the position of an edge defining a resist pattern size. The predetermined value of the contrast may be determined with correlation to an experimental value. The predetermined value of the contrast may be 0.3 or less. The predetermined value of the contrast of the latent image may be a threshold contrast value. The thickness of the film underlying the resist film may include a thickness of an anti-reflection film formed on and under the resist film. The structure of the underlying film may include one layer constituting the underlying film. The structure of the underlying film may include a plurality of superposed layers constituting the underlying film. The structure of the underlying film may include a material for one layer constituting the underlying film. The structure of the underlying film may include materials for a plurality of superposed layers constituting the underlying film. The structure of the underlying film may further include an anti-reflection coating film. The structure of the underlying film further may include a material for layer constituting the underlying film. The structure of the underlying film further may include materials for a plurality of superposed layers constituting the underlying film. The structure of the underlying film further may include a material for the anti-reflection coating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate the preferred embodiments of the invention, and together with the general description given above and the detailed description of the preferred embodiments given below, serve to explain the principles of the invention.

DETAILED DESCRIPTION OF THE INVENTION

Embodiments of the present invention will now be described in detail with reference to the accompanying drawings.

First Embodiment

In the method of forming a resist pattern, according to a first embodiment of the present invention, the conditions of the thickness of the resist film and the thickness of the film underlying the resist film are selected through simulation using a commercially available simulator, before forming a resist pattern on a semiconductor wafer, in order to obtain a resist profile which does not contain a standing wave pattern or contains only a small standing wave pattern. After that, the resist pattern is formed under these conditions. The thickness of the underlying film includes the thickness of an anti-reflection coating film in a case where the anti-reflection coating film is formed on or under a layer constituting the resist film.

Figure 1:
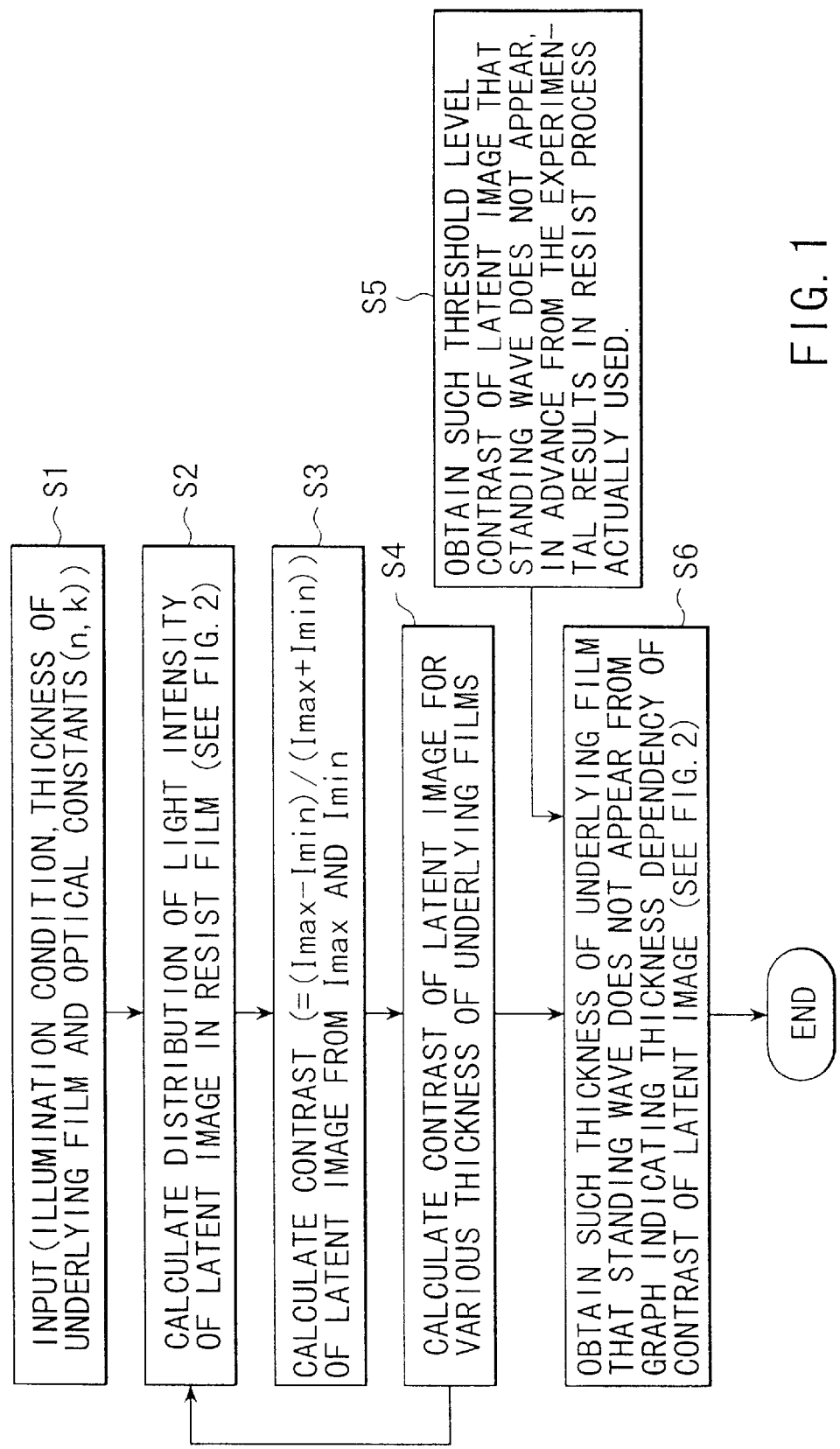
FIG. 1 is a flow chart illustrating the main steps of the method of forming a resist pattern, according to a first embodiment of the present invention.

FIG. 1 is a flow chart illustrating the main steps of the method of forming a resist pattern, according to the first embodiment of the present invention.

Figure 2:
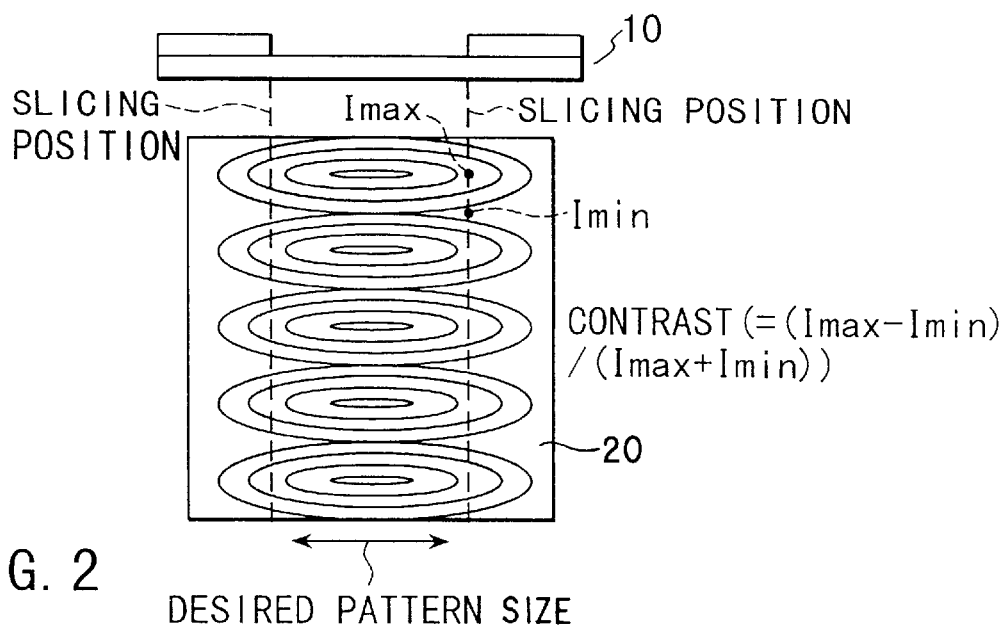
FIG. 2 is a diagram showing the results of a simulation of the distribution of the light intensity of the latent image within the resist film (by way of the contour of the light intensity), that is created by exposing a resist film to light in accordance with the flowchart of FIG. 1.

FIG. 2 is a diagram showing the results of a simulation of the distribution of the light intensity of the latent image within the resist film (by way of the contour of the light intensity), which is created by exposing a resist film to light in accordance with the flowchart of FIG. 1.

Figure 3:
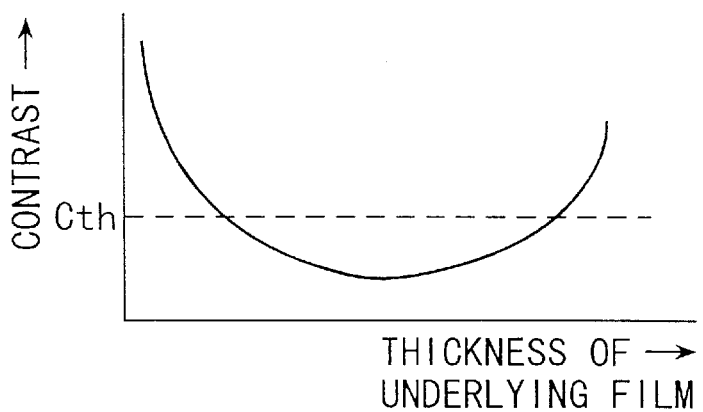
FIG. 3 is a characteristic diagram illustrating the results of a simulation to represent the correlation between the variation of the thickness of the film underlying the resist film and the variation of the contrast of the light intensity of the latent image with the resist film, in accordance with FIG. 1.

FIG. 3 is a characteristic diagram illustrating the results of a simulation to represent the correlation between the variation of the thickness of the film underlying the resist film and the variation of the light intensity contrast of the latent image with the resist film, in accordance with FIG. 1.

In the flowchart shown in FIG. 1, as the first step, the illumination conditions used in the actual exposure, i.e. stepper exposure, of the resist film on the wafer (i.e., the Numerical Aperture of the converging lens of the optical system, NA, the coherence factor, $\sigma$, the annular illumination, $\epsilon$, etc.), the thickness of the film underlying including the wafer) the resist film and the optical constants (n, k) are all input as parameters to the data processing device.

Next, as the second step, the distribution of the light intensity of the latent image (i.e., a latent image profile) in the resist film 20 shown in FIG. 2 is calculated. From the calculated light intensity distribution, two values are obtained. The first is a value (Imax) at the position where the latent image profile is sliced in the depth direction of the resist film and the light intensity at the sliced position is maximum. The second is a value (Imin) at the position where the latent image profile is sliced in the depth direction of the resist film and the light intensity at the sliced position is minimum. The sliced position defines the position of an edge of a desired resist pattern, that corresponds to the position of an end of a pattern of the mask 10. The value Imax denotes the maximum light intensity of the latent image at the sliced position, and the value Imin denotes the minimum light intensity of the latent image at the sliced position.

Then, as the third step, the contrast of the light intensity of the latent image at the sliced position, (Contrast)=(Imax−Imin)/(Imax+Imin), is obtained.

Next, as the fourth step, the above-described second and third steps are carried out with a different thickness of one layer of the underlying film (that is made of, for example, $SiO_2$). Thus, for the varied thickness, the contrast of the light intensity of the latent image, (Contrast)=(Imax−Imin)/(Imax+Imin), is obtained. By repeating the fourth step, the contrast of the light intensity of the latent image, (Contrast)=(Imax−Imin)/(Imax+Imin), is obtained for various thickness values. In this manner, the underlying film thickness dependency on the contrast of the latent image light intensity in the resist film is obtained.

Separate from the steps described above is the fifth step, whereby a threshold level contrast (Cth) of the latent image is obtained in the following manner. In advance, by experiment, resist pattern profiles are obtained for various thicknesses of one layer of the film underlying the resist film (which is made of, for example, TEOS) by changing the thickness of the one layer of the underlying film. Then, the resist pattern profiles obtained by the experiment are compared with the underlying film thickness dependency on the contrast obtained by the calculations made in the first through third steps under the same conditions as those of the experiment. At a level higher than the threshold level, a standing wave pattern appears, whereas at the threshold level or lower, a standing wave pattern does not appear.

The shape of the side wall of the resist pattern varies according to the value of the contrast. In order to avoid the appearance of the standing wave pattern or to suppress it to the minimum level, it is desirable that the threshold level of the contrast should be 0.3 or less.

Next, as the sixth step, from the contrast characteristics shown in FIG. 3, a thickness value is selected as the underlying film thickness for the underlying film so that the contrast becomes a threshold level or less (in this embodiment, it is 0.3 or less). It is also possible to select the thickness value of the underlying film, which indicates the minimum dependency value of the underlying film thickness dependency on the contrast. This was obtained by repeating the first step through the fourth step, to get a value of the thickness of the underlying film where the standing wave pattern least likely occurs. In other words, the thickness value of the underlying film and the value of the resist underlying film thickness, (which corresponds to the minimum value of the contrast) may be selected.

As described above, the profile of the latent image in the resist film is calculated and thus the contrast of the light intensity at the resist pattern edge, which defines an edge of a desired resist pattern, is obtained. In this manner, the shape of the standing wave that is created in the resist film can be determined quantitatively. Then, by selecting the minimum value for the shape of the standing wave, the thickness of the film underlying the resist (where the standing wave pattern least likely occurs) can be determined. Under these conditions, the resist pattern forming process is carried out, and therefore it becomes possible to form a resist pattern with less standing wave shape.

That is, the method of forming a resist pattern, according to the first embodiment of the present invention, is characterized by comprising the steps of:

calculating a light intensity profile of a latent image formed in a resist film in a depth direction by an exposure;

slicing the light intensity profile of the latent image in the depth direction of the resist film at a desired position;

obtaining a maximum value and a minimum value of light intensity of a latent image at the position where the latent image profile is sliced;

calculating the contrast of the latent image on the basis of the maximum and minimum values of the light intensity of the latent image; and determining a thickness of the resist film and a thickness of an underlying film under the resist film to have values so that the contrast becomes a threshold value or less; and forming a resist pattern on the semiconductor substrate on the basis of the values of the thicknesses determined in the determining step.

Second Embodiment

In the method of forming a resist pattern, according to a second embodiment of the present invention, the conditions of the thickness of the resist film and the structure and thickness of the film underlying the resist film are selected through simulation using a commercially available simulator. This is performed before a resist pattern is formed on a semiconductor wafer, in order to obtain a resist profile which does not contain a standing wave pattern or contains only a small standing wave pattern. Then the resist pattern is formed under these conditions. The structure of the underlying film includes one layer, constituting the underlying film, or a plurality of superposed layers, constituting the underlying film. The structure of the underlying film includes a material for one layer (constituting the underlying film) or materials for a plurality of superposed layers. The underlying film also includes an anti-reflection coating film in a case where the anti-reflection coating film is formed on or under a layer constituting the resist film.

The thickness of the underlying film includes a thickness of one layer, constituting the underlying film, or a plurality of superposed layers. The thickness of the underlying film includes the thickness of an anti-reflection coating film in a case where the anti-reflection coating film is formed on or under a layer constituting the resist film.

Figure 4:
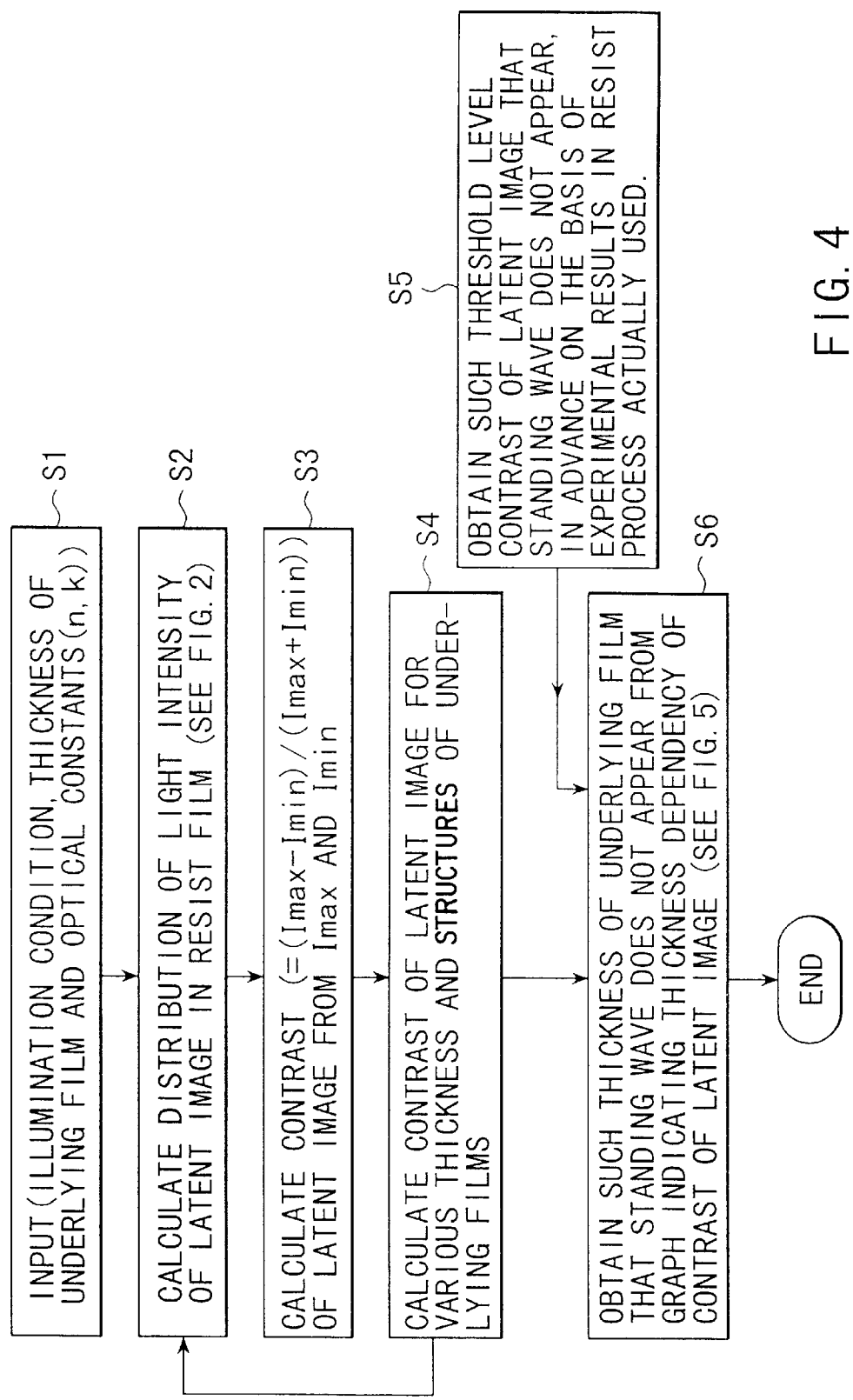
FIG. 4 is a flow chart illustrating the main steps of the method of forming a resist pattern, according to a second embodiment of the present invention.

FIG. 4 is a flow chart illustrating the main steps of the method of forming a resist pattern, according to a second embodiment of the present invention.

Figure 5:
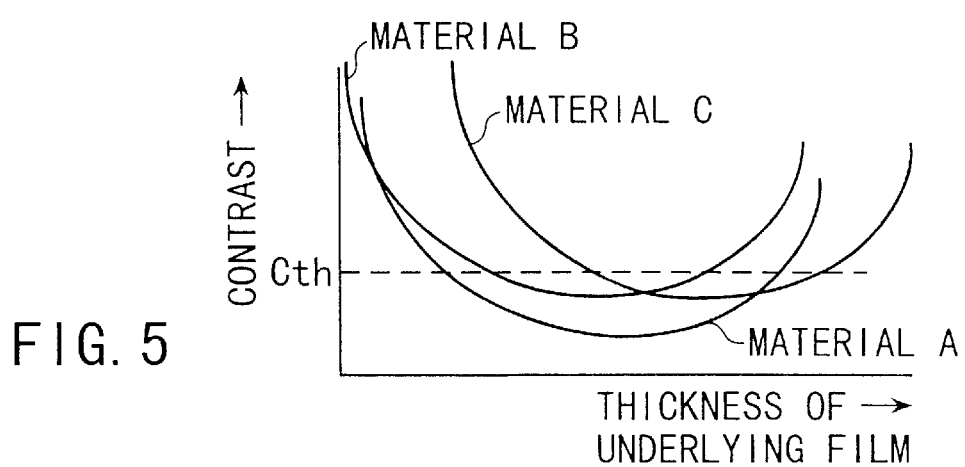
FIG. 5 is a characteristic diagram illustrating the results of a simulation to represent the correlation between the variation of the thickness of the film underlying the resist film and the variation of the contrast of the light intensity of the latent image within the resist film, in accordance with FIG. 4.

FIG. 5 is a diagram illustrating the results of a simulation representing the correlation between the variation of the thickness of the film underlying the resist and the variation of the contrast of the light intensity of the latent image within the resist film, in accordance with FIG. 4.

Figure 6:
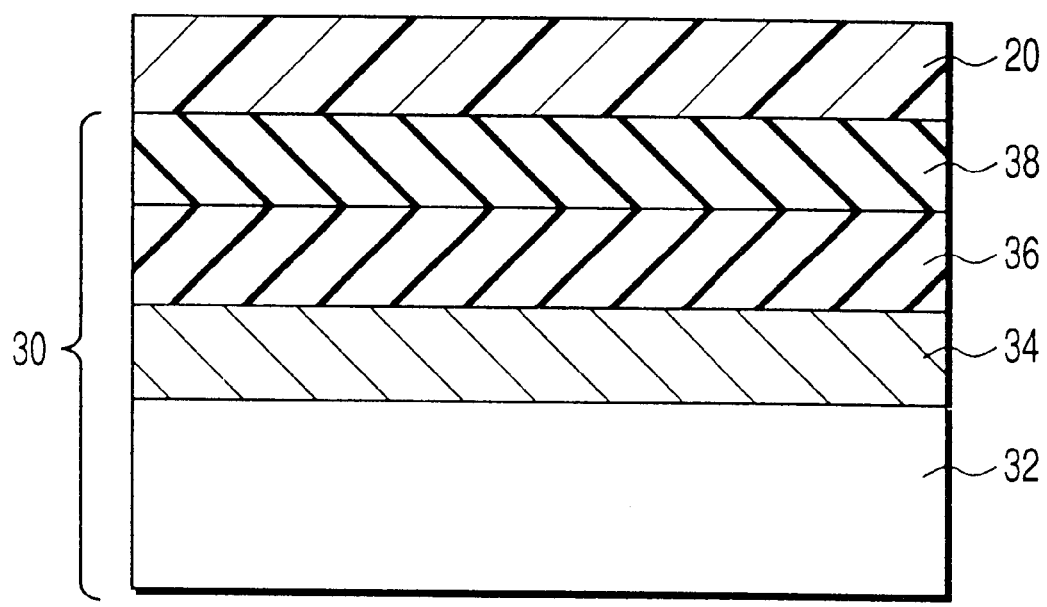
FIG. 6 is a diagram of a cross-sectional view of an example of the resist film and the underlying film.

FIG. 6 is a cross-sectional view of an example of the resist film 20 and the underlying film 30. As shown in FIG. 6, the example of the underlying film comprises a silicon wafer 32, a polysilicon layer 34, a silicon nitride layer 36, and an anti-reflection coating layer 38 superposed in that order. A resist film 20 is formed on the underlying film 30. The thickness of the underlying film shown in FIG. 6 includes a total of the thickness of the silicon wafer 32, the thickness of the polysilicon layer 34, the thickness of the silicon nitride layer 36, and the thickness of the anti-reflection coating layer 38.

In the flowchart shown in FIG. 4, as the first step, the illumination conditions used in the actual resist film exposure, for example stepper exposure, on the wafer (that is, the Numerical Aperture of the converging lens of the optical system, NA, the coherence factor, $\sigma$, the annular illumination, $\epsilon$, etc.), the thickness of the film underlying (including the wafer) the resist and the optical constants (n, k) are all input as parameters into the data processing device.

Next, as the second step, the distribution of the light intensity of the latent image (i.e., a latent image profile) in the resist film 20 shown in FIG. 2 is calculated. From the calculated light intensity distribution, two values are obtained. One value (Imax), is at the position where the latent image profile is sliced in the depth direction of the resist film and the light intensity at the sliced position is maximum. The other value (Imin), is at the position where the latent image profile is sliced in the depth direction of the resist film and the light intensity at the sliced position is minimum. The sliced position corresponds to an edge position of a desired resist pattern, which corresponds to a position of an end of a pattern of the mask 10. The value Imax denotes the maximum light intensity of the latent image at the sliced position, and the value Imin denotes the minimum light intensity of the latent image at the sliced position.

Then, as the third step, the contrast of the light intensity of the latent image at the sliced position, (Contrast)=(Imax−Imin)/(Imax+Imin), is obtained.

Next, as the fourth step, the above-described second and third steps are carried out with a different thickness of one layer of the underlying film (that is made of, for example, SiN). Thus, for the varied thickness, the contrast of the light intensity of the latent image, (Contrast)=(Imax−Imin)/(Imax+Imin), is obtained. By repeating the fourth step, the contrast of the light intensity of the latent image, (Contrast)=(Imax−Imin)/(Imax+Imin), is obtained for various thickness values. In this manner, the underlying film thickness dependency on the light intensity contrast of the latent image in the resist film is obtained.

Also, as the fourth step, the above-described part of the fourth step is repeated for a different structure (i.e., in this embodiment, a different material) of the underlying film. (For example, SiN is changed to TEOS.) In this manner, the underlying film thickness dependency can be obtained for an underlying film that is made of a different material. Further, by repeating the above-described fourth step for various underlying film materials, the underlying film thickness dependency on its contrast can be obtained. Thus, the material dependency of the contrast can be provided.

Apart from the steps described so far, as the fifth step, a threshold level contrast (Cth) of the latent image is obtained in the following manner. That is, in advance, by experiment, resist pattern profiles are obtained for various thicknesses of one layer of the film underlying the resist film (that is made of, for example, TEOS) by changing the thickness of the one layer of the underlying film. Then, the resist pattern profiles obtained by the experiment are compared with the underlying film thickness dependency on the contrast obtained by the calculations made in the first through third steps under the same conditions as those of the experiment. At a level higher than the threshold level, a standing wave pattern appears, whereas at or below the threshold level, a standing wave pattern does not appear.

The shape of the sidewall of the resist pattern varies to follow the value of the contrast. In order to avoid the appearance of the standing wave pattern or to suppress it to the minimum level, it is desirable that the threshold level of the contrast should be to 0.3 or less.

Next, as the sixth step, from the contrast characteristics shown in FIG. 5, a material is selected as the material for the underlying film such that the contrast becomes a threshold level or less (in this embodiment, it is 0.3 or less). Any one of the underlying films whose contrast characteristic curves are shown in FIG. 5 is made of such a material that the contrast becomes the threshold level or less (in this embodiment, it is 0.3 or less). Also, as the sixth step, from the contrast characteristics shown in FIG. 5, such a thickness value is selected as the thickness for the underlying film such that the contrast becomes a threshold level or less. It is also possible to select the thickness value of the underlying film, which indicates the minimum dependency value out of the values of the underlying film thickness dependency on the contrast. This was obtained by repeating the first step through the fourth step, to obtain a value of the thickness of the underlying film with which the standing wave pattern least likely occurs. In other words, as the thickness value of the underlying film, the value of the resist underlying film thickness, which corresponds to the minimum value of the contrast, may be selected.

As described above, the method of forming a resist pattern, according to the second embodiment of the present invention, is characterized by selecting the structure of the resist underlying film (for example, the material for the resist). This is useful when determining the thickness of the underlying film because the contrast comes to have a predetermined value as in the first embodiment.

In each of the above embodiments, the contrast of the light intensity of the latent image at a position on the edge in the resist film is obtained, (where edge position defines a resist pattern size). Taking variations of the size of the resist pattern into consideration, however, the position for obtaining the contrast is not limited to the above-described position.

As described above, according to the present invention, there is provided a method of forming a resist pattern that is capable of optimizing the thickness of the resist film, the thickness of the underlying film of the resist, and the structure of the underlying film under a condition where the type of the resist has been determined, in order to minimize the occurrence of a standing wave within the resist film.

Additional advantages and modifications will occur readily to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a resist pattern comprising the steps of:

calculating a light intensity profile of a latent image formed in a resist film in a depth direction thereof;

slicing the light intensity profile of the latent image in the depth direction of the resist film, at a desired position where the latent image profile is sliced in the depth direction of the resist film;

obtaining a maximum value and a minimum value of the light intensity of the latent image in the depth direction of the resist film at the position where the latent image profile is sliced;

calculating a contrast of the latent image on the basis of the maximum and minimum values of the light intensity of the latent image;

determining a thickness of the resist film and a thickness of an underlying film of the resist film to have values so that the contrast becomes a threshold value or less; and forming a resist pattern on the semiconductor on the basis of the values of the thickness determined in the determining step.

2. A method of forming a resist pattern, according to claim 1, wherein the determining step further includes determination of a structure of the underlying film of the resist film.

3. A method of forming a resist pattern, according to claim 1, wherein the position where the latent image profile is sliced is a position of an edge defining a resist pattern size.

4. A method of forming a resist pattern, according to claim 1, wherein the predetermined value of the contrast is determined with correlation to an experimental value.

5. A method of forming a resist pattern, according to claim 1, wherein the predetermined value of the contrast is 0.3 or less.

6. A method of forming a resist pattern, according to claim 1, wherein the predetermined value of the contrast of the latent image is a threshold contrast value.

7. A method of forming the resist pattern, of claim 1, wherein the thickness of the film underlying the resist film includes a thickness of an anti-reflection film formed on and under the resist film.

8. A method of forming a resist pattern, according to claim 2, wherein the position where the latent image profile is sliced is a position of an edge defining a resist pattern size.

9. A method of forming a resist pattern, according to claim 2, wherein the predetermined value of the contrast is determined with correlation to an experimental value.

10. A method of forming a resist pattern, according to claim 2, wherein the predetermined value of the contrast is 0.3 or less.

11. A method of forming a resist pattern, according to claim 2, wherein the predetermined value of the contrast of the latent image is a threshold contrast value.

12. A method of forming a resist pattern, according to claim 2, wherein the thickness of the underlying film of the resist film includes a thickness of an anti-reflection film formed on and under the resist film.

13. A method of forming a resist pattern, according to claim 2, wherein the structure of the underlying film includes one layer constituting the underlying film.

14. A method of forming a resist pattern, according to claim 2, wherein the structure of the underlying film includes a plurality of superposed layers constituting the underlying film.

15. A method of forming a resist pattern, according to claim 2, wherein the structure of the underlying film includes a material for one layer constituting the underlying film.

16. A method of forming a resist pattern, according to claim 2, wherein the structure of the underlying film includes materials for a plurality of superposed layers constituting the underlying film.

17. A method of forming a resist pattern, according to claim 2, wherein the structure of the underlying film further includes an anti-reflection coating film.

18. A method of forming a resist pattern, according to claim 2, wherein the structure of the underlying film further includes a material for layer constituting the underlying film.

19. A method of forming a resist pattern, according to claim 17, wherein the structure of the underlying film further includes a material for the anti-reflection coating film.

* * * * *